United States Patent [19]

Iwasaki et al.

[11] Patent Number: 4,548,892
[45] Date of Patent: Oct. 22, 1985

[54] PHOTOPOLYMERIZABLE COMPOSITION CONTAINING ACYLHALOACETIC ACID AMIDE DERIVATIVES

[75] Inventors: Masayuki Iwasaki; Minoru Maeda; Fumiaki Shinozaki, all of Shizuoka; Kouichi Kawamura, Kanagawa, all of Japan

[73] Assignee: Fuji Photo Film Co., Ltd., Kanagawa, Japan

[21] Appl. No.: 696,214

[22] Filed: Jan. 29, 1985

[30] Foreign Application Priority Data

Jan. 30, 1984 [JP] Japan ................................. 59-14819

[51] Int. Cl.$^4$ .............................................. G03C 1/68
[52] U.S. Cl. .................................. 430/288; 430/281; 430/919; 430/923; 430/925; 204/159.23; 204/159.24
[58] Field of Search ............... 430/281, 288, 919, 921, 430/923, 925; 204/159.23, 159.24

[56] References Cited

U.S. PATENT DOCUMENTS

| | | | |
|---|---|---|---|
| 3,429,795 | 2/1969 | Delzenne | 430/921 |
| 3,787,212 | 1/1974 | Heimsch et al. | 430/923 |
| 3,827,957 | 8/1974 | McGinniss | 430/923 |
| 3,827,958 | 8/1974 | McGinniss | 430/923 |
| 3,877,940 | 4/1975 | Ericson | 430/617 |
| 4,115,224 | 9/1978 | Havinga | 430/923 |
| 4,298,679 | 11/1981 | Shinozaki et al. | 430/919 |

Primary Examiner—Jack P. Brammer
Attorney, Agent, or Firm—Sughrue, Mion, Zinn, Macpeak and Seas

[57] ABSTRACT

A photopolymerizable composition is described, containing an addition polymerizable, unsaturated compound having two or more ethylenically unsaturated double bonds within the molecule and a photopolymerization initiator, wherein said photopolymerization initiator is an acylhaloacetic acid amide derivative represented by formula (I)

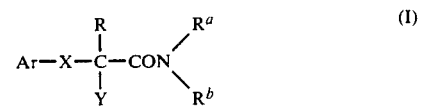

wherein Ar represents a substituted or unsubstituted aryl group, X represents a carbonyl or sulfonyl group, Y represents a chlorine atom or a bromine atom, R represents a hydrogen atom, a chlorine atom or a bromine atom, and $R^a$ and $R^b$ each represents a hydrogen atom, a substituted or unsubstituted alkyl group, an aryl group, or an aralkyl group.

17 Claims, No Drawings

PHOTOPOLYMERIZABLE COMPOSITION CONTAINING ACYLHALOACETIC ACID AMIDE DERIVATIVES

FIELD OF THE INVENTION

This invention relates to a photopolymerizable composition containing a novel photopolymerization initiator. More particularly, it relates to a photopolymerizable composition having high sensitivity and providing photohardened film of excellent film strength, suited for preparing lithographic printing plates, resinous letterpresses, resists, and photomaks for making print bases.

BACKGROUND OF THE INVENTION

Photopolymerizable compositions fundamentally comprise a photopolymerization initiator and a polyfunctional monomer, and are hardened upon being irradiated with light to become insoluble in solvents. Such compositions are widely used in photography, printing, surface processing of metals, inks, etc., utilizing the above-noted property. See J. Kosar, *Light Sensitive Systems,* J. Wiley & Sons., New York, 1965, pp. 158–193.

Studies on photopolymerizable compositions have been made to enhance sensitivity thereof to light, and many photopolymerization initiators have been proposed; for example, benzoin ethers are described in U.S. Pat. No. 2,448,828, benzoins are described in U.S. Pat. No. 2,722,512, anthraquinones are described in U.S. Pat. No. 3,046,127, aminophenylketones and active methyl or amino compounds are described in Japanese Patent Publication No. 11936/74 (corresponding to U.S. Pat. No. 3,661,588), Michler's ketone and benzophenone are described in U.S. Pat. No. 3,682,641, benzophenone and 4-N,N-dimethylaminobenzophenone are described in Japanese Patent Publication No. 38403/73 (corresponding to U.S. Pat. No. 3,549,367), etc. These photopolymerization initiators generally improve photosensitivity to some extent, but the resulting photo-hardened products (particularly film-like hardened products) have mechanical properties that are not necessarily sufficient for various end-uses.

For example, when used as dry film resist to be used in preparing printed circuit plates, they provide insufficient film strength after photo-hardening. Japanese Patent Publication No. 25231/70 (corresponding to U.S. Pat. No. 3,469,932) describes dry film resists for preparing printed circuit plates, and more detailed descriptions are set forth, for example, in W. S. De Forest, *Photo-resist,* McGraw-Hill, New York, 1975, pp. 163–212. The main use of dry film resist is for preparation of through-holes by tenting. However, conventionally known photopolymerization initiators have often caused the problem of film breakage during developing and etching steps due to insufficient strength of the tenting film (hereinafter, referred to as "tent").

On the other hand, in some cases exposed portions and unexposed portions are required to be discriminated from each other in exposing procedures. For example, when procedures are interrupted in the course of exposing many presensitized printing plates at the same time, plate-making workers want to known whether plates given to them have been exposed or not. In the case of exposing a large plate many times, there is a need to know to what extent the plate has been exposed. In such cases, it is preferable that exposed portions and unexposed portions can be discriminated from each other.

For this purpose, a photopolymerizable composition including a free radical-generating agent capable of generating a free radical upon irradiation with light and an agent which undergoes a change in color by reaction with the free radical has been employed, to thereby form a visible image after exposure. As the free radical-generating agent, organic halogen compounds are useful, including carbon tetrabromide, iodoform, and phenyltribromomethylsulfone as disclosed in Japanese Patent Publication No. 29407/68 (corresponding to U.S. Pat. No. 3,502,476), 2-halomethyl-5-vinyl-1,3,4-oxadiazole compounds as disclosed in Japanese Patent Application (OPI) No. 24113/80 (The term "OPI" as used herein refers to a "published unexamined Japanese patent application".), etc.

However, the goal of obtaining a high-contrast visible image after long-term storage without detrimental influences on film strength of photo-hardened film has not been fully attained.

SUMMARY OF THE INVENTION

It is, therefore, an object of the present invention to provide a photopolymerizable composition capable of providing a photo-hardened film having excellent strength.

Another object of the present invention is to provide a photopolymerizable composition having high photosensitivity.

A further object of the present invention is to provide a light-sensitive composition which gives a high-contrast visible image when exposed, and which does not form print-out fog even after being stored at high temperatures under high humidity.

These and other objects of the present invention will become apparent from the following description.

As a result of extensive investigations, it has now been found that a photopolymerizable composition containing a particular photopolymerization initiator enables achieving the above-described and other objects.

That is, the objects of the present invention can be attained by a photopolymerizable composition containing an addition-polymerizable unsaturated compound (polyfunctional monomer) having two or more ethylenically unsaturated double bonds within its molecule and a photopolymerization initiator, which contains as the initiator an acylhaloacetic acid amide derivative represented by formula (I)

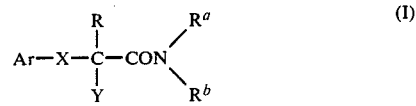
(I)

wherein Ar represents a substituted or unsubstituted aryl group, X represents a carbonyl or sulfonyl group, Y represents a chlorine atom or a bromine atom, R represents a hydrogen atom, a chlorine atom or a bromine atom, and $R^a$ and $R^b$ (which may be the same or different) each represents a hydrogen atom, a substituted or unsubstituted alkyl group, an aryl group, or an aralkyl group.

DETAILED DESCRIPTION OF THE INVENTION

In formula (I), Ar represents a substituted or unsubstituted aryl group which may be substituted, for example, preferably with an alkyl group ($C_1$ to $C_8$), an alkoxy group ($C_1$ to $C_8$), a halogen atom, a cyano group, an aryl group ($C_6$ to $C_{12}$), an aralkyl group ($C_7$ to $C_{13}$), etc. The preferred examples of Ar include a phenyl group, a p-tolyl group, a p-n-propylphenyl group, a p-chlorophenyl group, a o-bromophenyl group, a p-chlorophenyl group, a 2,4-dichlorophenyl group, a 2,4,6-trichlorophenyl group, a p-cyanophenyl group, a p-phenylphenyl group, a p-benzylphenyl group, an α-naphthyl group, etc.

In formula (I), $R^a$ and $R^b$ (which may be same or different) each represents a hydrogen atom, a substituted or unsubstituted alkyl group, an aryl group or an aralkyl group. The preferred substituents thereof include an alkyl group ($C_1$ to $C_8$), an aryl group ($C_6$ to $C_{12}$) or an aralkyl group ($C_7$ to $C_{13}$). The preferred examples of $R^a$ and $R^b$ include a hydrogen atom, a methyl group, an ethyl group, a n-propylphenyl group, a p-tolyl group, an α-naphthyl group, a benzyl group, etc.

Preferable specific examples of compounds useful as polymerization initiators in accordance with the present invention represented by formula (I) are illustrated below.

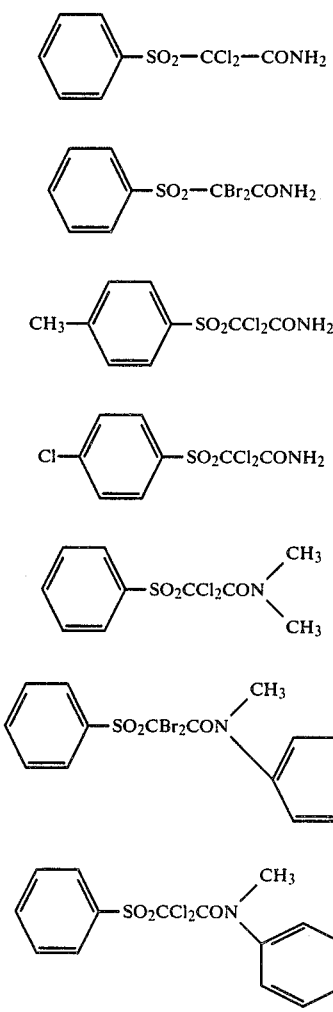

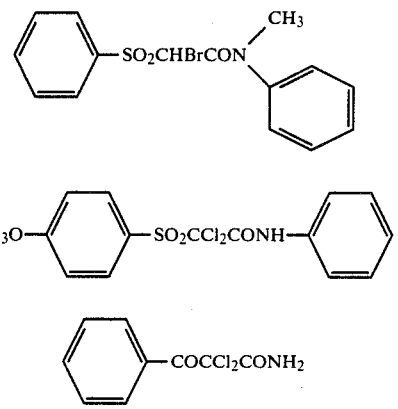

All of these compounds can be synthesized according to the process described in *Journal of Chemical and Engineering Data*, Vol. 20, No.2, p.214 (1975) or *Methoden der Organishen Chemie*, (Houen-Weyl)Band 5/3, 5/4 George Thieme Verlag, Stuttgart (1962) (compiled by Eugen Müller).

These acylhaloacetic acid amides show excellent photopolymerization-initiating ability when used alone, but, since they absorb light rays of shorter wavelength, they are not totally satisfactorily adapted to the often employed high-pressure mercury lamp or super-high pressure mercury lamp. Therefore, they are preferably used in combination with other photopolymerization initiators having absorption in the UV region and/or visible region. As the other photopolymerization initiators, known compounds such as aromatic ketones, aldehydes, quinones, etc., are suited. Preferable aromatic ketones include 4,4'-bis(dialkylamino)benzophenones represented by formula (IIa), benzophenones represented by formula (IIb), and cyclic ketones represented by formula (IIc).

Formula (IIa) is represented by

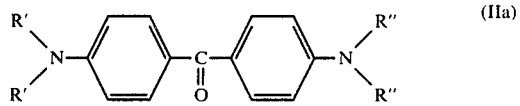

wherein R' and R" (which may be the same or different) each represents an alkyl group containing from 1 to 6 carbon atoms, a cycloalkyl or hydroxyalkyl group, or, when taken together with other R' or R" bound to the same nitrogen atom, represents a tetramethylene, pentamethylene, or oxybisethylene group.

Formula (IIb) is represented by

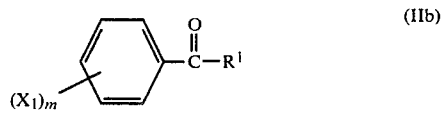

wherein $R^1$ represents a hydrogen atom or

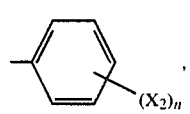

$X_1$ and $X_2$ each represents an alkyl group, an alkoxy group, a carboxy group, an alkoxycarbonyl group, an aryloxycarbonyl group, or a halogen atom, and m and n each represents 0, 1, or 2 (where m and n represent 2, each of the $X_1$'s and each of the $X_2$'s may be the same or different).

Formula (IIc) is represented by

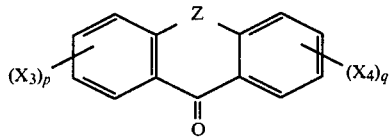
(IIc)

wherein $X_3$ and $X_4$ each represents an alkyl group, an alkoxy group, a carboxy group, an alkoxycarbonyl group, an aryloxycarbonyl group, or a halogen atom, p and q each represents 0, 1, or 2 (where p and q represent 2, each of the $X_3$'s and each of the $X_4$'s may be the same or different), and Z represents a single bond, an oxygen atom, a sulfur atom, an alkyl-substituted or unsubstituted amino group, or a carbonyl group.

Preferable specific examples of the compounds represented by formula (IIa) include 4,4'-bis-(dimethylamino)benzophenone, 4,4'-bis(dicyclohexylamino)benzophenone, 4,4-bis(diethylamino)benzophenone, 4,4'-bis(dihydroxyethylamino)benzophenone, etc.

Preferable specific examples of the compounds represented by formula (IIb) include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenonetetracarboxylic acid or tetramethyl esters thereof, etc.

Preferable specific examples of the compounds represented by the general formula (IIc) include anthraquinone, 2-t-butylanthraquinone, 2-methylanthraquinone, 9-fluorenone, xanthone, 2-chloroxanthone, thioxanthone, 2-chlorothioxanthone, 2-methylthioxanthone, 2-isopropylthioxanthone, 2,4-dimethylthioxanthone, 2,4-diethylthioxanthone, N-methylacridone, acridone, etc.

Preferable specific examples of aldehydes include p-dimethylaminobenzaldehyde, p-diethylaminobenzaldehyde, p-chlorobenzaldehyde, p-tolualdehyde, benzaldehyde, etc.

Preferable quinones include a compound represented by formula (IIc) wherein $X_3$, $X_4$, p and q are the same as described in formula (IIc) of the above aromatic ketones and Z represents a carbonyl group.

Typical examples of preferable polyfunctional monomers to be used in the photopolymerizable composition of the invention are as follows: acrylic or methacrylic esters of polyols described in Japanese Patent Publication Nos. 5093/60, 14719/60, 28727/69 (corresponding to British Pat. No. 1,154,872), etc., that is, diethyleneglycol diacrylate or dimethacrylate, triethyleneglycol diacrylate or dimethacrylate, tetraethyleneglycol diacrylate or dimethacrylate, pentaerythritol triacrylate or trimethacrylate, trimethylolpropane triacrylate or trimethacrylate, dipentaerythritol hexaacrylate or hexamethacrylate, 1,6-hexanediol diacrylate or dimethacrylate, etc.; bisacrylamides or bismethacrylamides such as methylenebisacrylamide or methylenebismethacrylamide, ethylenebisacrylamide or ethylenebismethacrylamide, etc.; polyfunctional monomers containing an urethane group or groups, such as di(2-methacryloxyethyl)-2,4-tolylenediurethane and di(2-acryloxyethyl)-hexamethylene-diurethane; and (meth)acrylurethane oligomers obtained by reacting a terminal isocyanato group-containing compound (obtained by previously reacting a polyol with a diisocyanate) with a β-hydroxyalkyl (meth)acrylate.

The photopolymerizable composition of the present invention contains the photopolymerization initiator and the polyfunctional monomer as necessary ingredients. If desired, a polymeric binder, a thermal polymerization inhibitor, a plasticizer, a dye, a color-changing agent, an ethylenically unsaturated monofunctional compound, an agent for accelerating adhesion to anodized aluminum or copper surface, and other aids may be used, which enables to prepare a wide variety of lithographic printing plates, resinous letterpresses, photoresists, photomasks, etc.

The above-described polymeric binders are those which are used for improving printability and physical properties of resists, and examples thereof include saturated or unsaturated, modified or non-modified alkyd or polyester resins, vinyl resins, acrylic resins, epoxy resins, xylene resins, aromatic sulfonamide-formaldehyde resins, ketone resins, petroleum resins, diallyl phthalate resins, melamine resins, rosin-modified phenol resins, natural resins (e.g., cellulose, cellulose derivatives, etc.), and the like. Particularly preferable examples thereof include alcohol-soluble nylon, poly(methyl methacrylate), poly(methyl methacrylate-co-methacrylic acid), etc.

The thermal polymerization inibitors are added for inhibiting thermal polymerization or polymerization with time of the photopolymerizable composition of the present invention, and examples thereof include p-methoxyphenol, hydroquinone, t-butylcatechol, pyrogallol, 2-hydroxybenzophenone, 4-methoxy-2-hydroxybenzophenone, cuprous chloride, phenothiazine, chloranil, naphthylamine, β-naphthol, 2,6-di-t-butyl-p-cresol, nitrobenzene, dinitrobenzene, picric acid, p-toluidine, etc.

The plasticizers are added for controlling physical properties of film, and examples thereof include phthalic acid esters (e.g., dibutyl phthalate, diheptyl phthalate, dioctyl phthalate, diallyl phthalate, etc.), glycol esters (e.g., triethylene glycol diacetate, tetraethyleneglycol diacetate, etc.), phosphoric acid esters (e.g., tricresyl phosphate, triphenyl phosphate, etc.), amides (e.g., p-toluenesulfonamide, benzenesulfonamide, N-n-butylacetamide, etc.), aliphatic dibasic acid esters (e.g., diisobutyl adipate, dioctyl adipate, dimethyl sebacate, dioctyl azelate, dibutyl maleate, etc.), triethyl citrate, tributyl citrate, glycerin triacetyl ester, butyl laurate, dioctyl 4,5-di-epoxycyclohexane-1,2-dicarboxylate, etc.

The dyes are exemplified by Brilliant Green, Eosine, Ethyl Violet, Erythrosine B, Methyl Green, Crystal Violet, Basic Fuchsine, Phenolphthalein, 1,3-diphenyltriazine, Alizarine Red S, Thymolphthalein, Methyl Violet 2B, Quinaldine Red, Rose Bengale, Metanil Yellow, Thymolsulfo-phthalein, Xylenol Blue, methyl Orange, Orange N, diphenylthiocarbazone, 2,7-dichlorofluoresceine, Paramethyl Red, Congo Red, Benzopurpurin 4B, α-naphthyl Red, Nile Blue A, phenacetaline, Methyl Violet, Malachite Green, Parafuchsine, Oil Blue #603 (made by Orient Kagaku Kogyo K.K.), Rhodamine B, Rhodamine 6G, Victoria Pure Blue BOH, Spiron Blue GN (made by Hodogaya Chemical Co., Ltd.), etc.

The color-changing agents are added to the photopolymerizable composition so as to provide visible image upon exposure. Specific examples thereof include diphenylamine, dibenzylaniline, triphenylamine, diethylaniline, diphenyl-p-phenylenediamine, p-toluidine, 4,4'-biphenyldiamine, o-chloroaniline, p,p',p''-hexamethyltriaminotriphenylmethane, p,p'-tetramethyldiaminotriphenylmethane, p,p'-bis(dimethylamino)-p''-monomethylaminotriphenylmethane, p,p',p''-triaminotriphenylcarbinol, carbazolylmethane compounds, etc., in addition to the aforesaid dyes.

Specific examples of the monofunctional ethylenically unsaturated compounds include ethyleneglycol monoacrylate or monomethacrylate, triethyleneglycol methyl ether acrylate or methacrylate, ethyleneglycol phenyl ether acrylate or methacrylate, tetraethyleneglycol monoacrylate or monomethacrylate, diacetoneacrylamide, acrylamide, methacrylamide, N-n-butylacrylamide or methacrylamide, etc.

Specific examples of the adhesion-accelerating agents include those described in Japanese Patent Publication No. 9177/75 (corresponding to U.S. Pat. No. 3,645,772) such as benzimidazole, benzothiazole, benzoxazole, benzotriazole, etc., and those described in Japanese Patent Application (OPI) No. 702/78 such as 2-mercaptobenzothiazole, 2-mercaptobenzimidazole, etc.

Preferable and particularly preferable ranges for the foregoing constituents are set forth below, in parts for 100 parts by weight of the polyfunctional monomer.

|  | Preferable Range | Particularly Preferable Range |
| --- | --- | --- |
| Compound I | 0.01–100 | 0.1–50 |
| Compound (IIa), (IIb), or (IIc) | 0.01–100 | 0.1–50 |
| Polymeric Binder | 0–10000 | 0–1000 |
| Thermal Polymerization Inhibitor | 0–50 | 0–20 |
| Plasticizer | 0–1000 | 0–100 |
| Dye | 0–100 | 0–50 |
| Color-changing Agent | 0–100 | 0–50 |
| Monofunctional Ethylenically Unsaturated Compound | 0–1000 | 0–100 |
| Adhesion-Accelerating Agent | 0–50 | 0–20 |

The photopolymerizable composition of the present invention is used by dissolving the aforesaid constituents in a solvent and coating the resulting solution on a desired support in a conventional known manner as described, for example, in U.S. Pat. No. 3,469,982. As the solvent, ethylene dichloride, monochlorobenzene, cyclohexanone, methyl ethyl ketone, acetone, methyl cellosolve acetate, ethyl acetate, methyl acetate, methyl cellosolve, toluene, xylene, etc. are used alone or in combination.

The photopolymerizable composition of the present invention is suited as a photoresist layer of dry film resist. When used as the photoresist layer, the composition is preferably coated in a thickness of from 0.1 $\mu$m to 500 $\mu$m, and particularly preferable from 1 $\mu$m to 200 $\mu$m. In the case of using the photopolymerizable composition of the present invention to prepare light-sensitive lithographic printing plate precursors, the composition is preferably coated (in a dry amount) of from 0.1 to 10.0 g/m$^2$, and particularly preferably from 0.5 to 5.0 g/m$^2$.

In using the photopolymerizable composition of the present invention as a dry film resist, preferable supports are selected from among polyamides, polyolefins, polyesters, vinyl polymers, cellulose esters, etc., of from 3 $\mu$m to 100 $\mu$m in thickness. Particularly preferable support films are transparent polyethylene terephthalate films of about 25 $\mu$m in thickness. In this case, suitable protective film to be used includes polyolefins, particularly polyethylene film of 20 to 25$\mu$ in thickness.

In using the photopolymerizable composition of the present invention for producing films for photomasks, polyethylene terephthalate film having vacuum-deposited thereon aluminum, aluminum alloy or chromium and polyethylene terephthalate films having provided thereon a colored layer are suitably used as supports.

Suitable supports to be used when the photopolymerizable composition of the present invention is used as a light-sensitive layer of light-sensitive lithographic printing plate include aluminum plates having been rendered hydrophilic, such as silicate-treated aluminum plates, anodized aluminum plates, grained aluminum plates, and silicate-electrodeposited aluminum plates, and, in addition, zinc plates, stainless steel plates, chromium-treated copper plates, and plastic film or paper having been rendered hydrophilic.

Supports to be used when the photopolymerizable composition of the present invention is used for producing color proofs for printing, for films for overhead projector, or for films for preparing second original, include transparent films such as polyethylene terephthalate film, cellulose triacetate film, etc., and chemically or physically surface-matted films thereof.

It is quite surprising that the photopolymerizable initiator of the present invention shows an enhanced sensitivity and high photo-hardened film strength. As a result, when used as dry film resist, the composition of the present invention provides an enhanced spray impact resistance of "tent", thus improving reliability of "tent" and, when used for making lithographic printing plates, it remarkably improves printing life, whereby plate-making costs are reduced. Further, when used as a light-sensitive layer for photomasks or color proof, it provides an enhanced image strength, leading to prolonged photomask or color proof life. In addition, it does not require special handling, in contrast to conventional materials, leading to improved working efficiency.

Excellent developability of the photopolymerizable composition of the present invention prevents formation of scums and printing stains.

Dry film resists or light-sensitive materials previously provided with light sensitivity such as light-sensitive lithographic printing plates or color proofs using the photopolymerizable composition of the present invention have a good storage life due to the good stability of the composition.

The photopolymerization initiator of the present invention has a high ability for photo-changing the color of a leuco-dye or other dye added at the same time, and hence it is possible to impart print-out properties to the photoresist or light-sensitive lithographic printing plate.

The present invention is illustrated in greater detail by reference to the following examples which, however, are not to be construed as limiting the present invention in any way.

EXAMPLE 1

The following coating solutions containing varying photopolymerization initiators and other common components were prepared. The kind and the amount of the photopolymerization initiator used are set forth in Table 1.

| | |
|---|---|
| Poly(methyl methacrylate) (average molecular weight: 140,000) | 15 g |
| Tetraethyleneglycol diacrylate | 6.1 g |
| Trimethylolpropane triacrylate | 2.4 g |
| Photopolymerization initiator | X g |
| Leuco-Crystal Violet | 0.08 g |
| Victoria Pure Blue BOH (trade mark) | 0.01 g |
| p-Toluenesulfonamide | 1.62 g |
| p-methoxyphenol | 0.01 g |
| Methyl ethyl ketone | 45 g |

Each of the four coating solutions containing different photopolymerization initiators was coated on a polyethylene terephthalate film (25 μm thick), then dried in a 100° C. oven for 2 minutes to form an approximately 50 μm thick coat. Each of them was laminated on a copper-clad laminate at 120° C. Then, a step wedge of 0.15 in optical density difference was superposed thereon, and irradiation was conducted under reduced pressure for 80 counts using a 2 KW super-high pressure mercury lamp (made by ORC; jet printer). After delaminating the polyethylene terephthalate film support for the exposed laminates, they were dipped in 1,1,1-trichloroethane for 60 seconds to dissolve away unexposed portions. Sensitivity of them was determined by reading clear step number from the thus obtained step wedge image. The higher the step number, the higher the sensitivity. Results thus obtained are shown in Table 1.

Separately, four kinds of unexposed coats on polyethylene terephthalate film were respectively laminated on both sides of brushed, scrubbed and dried copper-clad laminate (having 40 through-holes of 2.5 mm in diameter) at 120° C. using an A-24 laminator (made by Du Pont Co.). Photomasks of 3.0 mm in land diameter were superposed on respective laminates in a manner such that the masks covered the through-holes, and exposure was conducted so that each light-sensitive layer showed six-step sensitivities. Then, polyethylene terephthalate film supports were removed from respective laminates, and unexposed resist portions were removed by spraying 1,1,1-trichloroethane to develop them. With resists other than film No. 3, all through-holes of the laminates were covered with photo-hardened film ("tent"). Film strength of the "tent" was determined by applying a metal needle of 0.6 mm in diameter to the "tent" in a perpendicular direction with respect to the "tent" to measure the "tent" breakage load, and averaging the thus obtained loads. The results obtained are tabulated in Table 1.

TABLE 1

| Film Sample No. | Polymerization Initiator | Added Amount (g) | Sensitivity (step) | Film Strength (g) |
|---|---|---|---|---|
| No. 1 (Invention) | 4,4-Bis(diethylamino)-benzophenone | 0.04 | 13 | 217 |
| | Benzophenone | 0.45 | | |
| | Benzenesulfonyl-dibromoacetic acid amide | 0.35 | | |
| No. 2 (Invention) | 4,4'-Bis(diethylamino)-benzophenone | 0.04 | 9 | 180 |
| | Benzenesulfonyl-dibromoacetic acid amide | 0.35 | | |

TABLE 1-continued

| Film Sample No. | Polymerization Initiator | Added Amount (g) | Sensitivity (step) | Film Strength (g) |
|---|---|---|---|---|
| No. 3 (Comparison) | 4,4'-Bis(diethylamino)-benzophenone | 0.04 | no image | impossible to measure |
| No. 4 (Comparison) | 4,4'-Bis(diethylamino)-benzophenone | 0.04 | 11 | 130 |
| | Benzophenone | 0.45 | | |

As is clear from Table 1, the film sample Nos. 1 and 2 in accordance with the present invention showed high sensitivity and greater tenting film strength in comparison with film sample No. 4 using a conventionally known photopolymerization initiator. Film sample No. 3 had such a low sensitivity that no image was obtained, and film strength of the sample could not be measured.

EXAMPLE 2

Coatings were formed in the same manner as in Example 1 using the photopolymerization initiators shown in Table 2 to evaluate sensitivity and tenting film strength in the same manner as in Example 1. The results thus obtained are shown in Table 2.

In every case, it is seen that the use of the photopolymerization initiator of the present invention gave a coating with high sensitivity and high tenting film strength.

TABLE 2

| Film No. | Photopolymerization Initiator | Added Amount (g) | Sensitivity (step) | Tenting Film Strength (g) |
|---|---|---|---|---|
| No. 5 (Invention) | 4,4'-Bis(dimethylamino)-benzophenone | 0.04 | 12 | 210 |
| | Benzophenone | 0.45 | | |
| | Benzenesulfonyldibromoacetic acid amide | 0.20 | | |
| No. 6 (Invention) | 4,4'-Bis(diethylamino)-benzophenone | 0.04 | 11 | 178 |
| | Benzophenone | 0.45 | | |
| | Benzenesulfonyldichloroacetic acid amide | 0.70 | | |
| No. 7 (Invention) | 4,4'-Bis(diethylamino)-benzophenone | 0.04 | 11 | 185 |
| | Benzophenone | 0.45 | | |
| | Benzenesulfonyldichloroacetic acid N—methylanilide | 0.60 | | |
| No. 8 (Invention) | 4,4'-Bis(diethylamino)-benzophenone | 0.04 | 13 | 216 |
| | Benzophenone | 0.45 | | |
| | Benzenesulfonyl-monobromo-acetic acid N—methylanilide | 0.60 | | |
| No. 9 (Invention) | 4,4'-Bis(diethylamino)-benzophenone | 0.04 | 11 | 225 |
| | Benzophenone | 0.45 | | |
| | Benzenesulfonyldibromoacetic acid N—methylanilide | 0.20 | | |
| No. 10 (Invention) | 4,4'-Bis(diethylamino)-benzophenone | 0.04 | 9 | 170 |
| | Benzenesulfonyldichloroacetic acid amide | 0.35 | 9 | 170 |
| No. 11 (Invention) | 2,4-Dimethyl-thioxanthone | 0.33 | 13 | 160 |
| | Ethyl dimethyl-aminobenzoate | 0.30 | | |

TABLE 2-continued

| Film No. | Photopolymerization Initiator | Added Amount (g) | Sensitivity (step) | Tenting Film Strength (g) |
|---|---|---|---|---|
| | Benzenesulfonyldi-chloroacetic acid amide | 0.35 | | |
| No. 12 (Invention) | 4,4'-Bis(diethylamino)-benzophenone | 0.04 | 14 | 195 |
| | 4-Benzoylpyridine | 0.47 | | |
| | Benzenesulfonyldi-chloroacetic acid amide | 0.35 | | |
| No. 13 (Invention) | 4,4'-Bis(diethylamino)benzophenone | 0.04 | 11 | 184 |
| | 2-Chlorothioxanthone | 0.35 | | |
| | Benzenesulfonyldi-chloroacetic acid amide | 0.35 | | |
| No. 14 (Comparison) | 4,4'-Bis(diethylamino)benzophenone | 0.04 | 13 | 205 |
| | Benzophenone | 0.45 | | |
| | Phenyltribromomethyl-sulfone | 0.40 | | |

EXAMPLE 3

Preparation of Print Base

Polyethylene film was delaminated from each of the sandwich-like laminates (film Nos. 1 to 4) obtained according to the process described in Example 1 and comprising polyethylene terephthalate film (25 μm thick), photopolymerizable layer (50 μm thick), and polyethylene film (25 μm thick) laminated thereon. Then, each of the laminates was laminated at 120° C. on both sides of a brushed, scrubbed and dried copper-clad laminate (having 100 each of through-holes of 2.5 mm, 1.5 mm, and 1.0 mm in diameter) using an A-24 laminator. Photomasks of 3.0 mm, 2.0 mm, and 1.4 mm in land diameter were superposed on respective laminates in a conventional manner, and exposure was conducted using a super-high pressure mercury lamp (20 counts) to produce photo-hardened resist films on both sides of respective through-holes. Polyethylene terephthalate film supports were removed from respective laminates, and unexposed resist portions were removed by spraying 1,1,1-trichloroethane to develop them. With resists other than film No. 3, respective through-holes were covered with photo-hardened film ("tent"). No defects were observed in the case of any "tent". Then, the thus developed laminates were subjected to high pressure hot water spray (54° C.) to test spray impact resistance of the "tent". The numbers of tents destroyed during the spraying are set forth in Table 3.

TABLE 3

| | Tents Destroyed by High-Pressure Spray (%) | | |
|---|---|---|---|
| Film No. | Diameter 2.5 mm | Diameter 1.5 mm | Diameter 1 mm |
| No. 1 | 3 | 0 | 0 |
| No. 2 | 5 | 2 | 0 |
| No. 4 | 85 | 76 | 63 |

It is clear that the film sample Nos. 1 and 2 in accordance with the present invention containing benzenesulfonyldibromoacetic acid amide provide tents which are substantially difficult to destroy.

EXAMPLE 4

Preparation of Negative-Working Lithographic Printing Plate

On a surface-grained and anodized 0.15-mm thick aluminum plate was coated the following light-sensitive solution using a whirler, then dried at 100° C. for 2 minutes to prepare a light-sensitive printing plate.

| | |
|---|---|
| Trimethylolpropane triacrylate | 0.38 g |
| Methyl methacrylate/methacrylic acid (90/10 in molar ratio) copolymer | 0.62 g |
| Michler's ketone | 0.04 g |
| Benzophenone | 0.02 g |
| Benzenesulfonyldibromoacetic acid amide | 0.02 g |
| Oil Blue #603 | 0.010 g |
| p-Methoxyphenol | 0.001 g |
| Leuco Crystal Violet | 0.008 g |
| Methylcellosolve acetate | 5 g |
| Methyl ethyl ketone | 5 g |

This light-sensitive lithographic printing plate was imagewise exposed, and developed with a developer composed of 1.2 g of caustic soda, 300 ml of isopropyl alcohol, and 900 ml of water to remove unexposed areas. Thus, a lithographic printing plate was obtained.

When printing was conducted using the thus obtained printing plate and a printing press, 430,000 distinct copies were obtained.

EXAMPLE 5

On each of the light-sensitive coats formed on polyethylene terephthalate film (Nos. 6–8 and 10–14) obtained in Example 2 was laminated a polyethylene film (25 μm thick) to prepare sandwich-like laminates.

These sandwich-like laminates were ripened for 7 days under conditions of 75% relative humidity and a temperature of 45° C. The polyethylene film was delaminated from each of non-ripened and ripened films. Then, the light-sensitive films were respectively laminated on the copper-clad laminate as in Example 1 to compare fog (background density) and print-out contrast (density difference between exposed film and unexposed film). The results thus obtained are set forth in Table 4.

TABLE 4

| Film No. | Contrast Before Ripening | After Ripening | |
|---|---|---|---|
| | | Fog | Contrast |
| No. 6 (Invention) | 0.25 | 0.03 | 0.25 |
| No. 7 (Invention) | 0.22 | 0.02 | 0.24 |
| No. 8 (Invention) | 0.25 | 0.06 | 0.23 |
| No. 10 (Invention) | 0.20 | 0.06 | 0.23 |
| No. 11 (Invention) | 0.15 | 0.04 | 0.18 |
| No. 12 (Invention) | 0.28 | 0.03 | 0.30 |
| No. 13 (Invention) | 0.31 | 0.05 | 0.28 |
| No. 14 (Comparison) | 0.41 | 0.78 | 0.05 |

As is clear from Table 4, film sample Nos. 6–8 and 10–13 (within the scope of the present invention) formed less fog and gave large print-out contrast even after ripening. It is also seen that the use of the conventionally known halogen compound involves the defects of increased fog and reduced contrast (film sample No. 14) after the ripening, thus not being practically usable.

While the present invention has been described in detail and with reference to specific embodiments thereof, it will be apparent to one skilled in the art that various changes and modifications can be made therein without departing from the spirit and the scope of the present invention.

What is claimed is:

1. A photopolymerizable composition containing an addition polymerizable unsaturated compound having two or more ethylenically unsaturated double bonds within the molecule and a photopolymerization initiator, wherein said photopolymerization initiator is an acylhaloacetic acid amide derivative represented by formula (I)

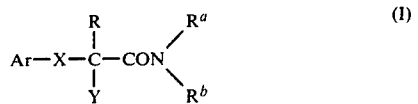

wherein Ar represents a substituted or unsubstituted aryl group, X represents a carbonyl or sulfonyl group, Y represents a chlorine atom or a bromine atom, R represents a hydrogen atom, a chlorine atom, or a bromine atom, and $R^a$ and $R^b$ each represents a hydrogen atom, a substituted or unsubstituted alkyl group, an aryl group, or an aralkyl group.

2. A photopolymerizable composition as in claim 1, wherein said photopolymerizable composition further contains a 4,4'-bis(dialkylamino)benzophenone represented by formula (IIa)

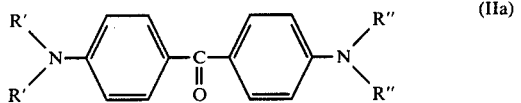

wherein R' and R" each represents an alkyl group containing from 1 to 6 carbon atoms, a cycloalkyl or hydroxyalkyl group, or, when taken together with other R' or R" bound to the same nitrogen atom, represents a tetramethylene, pentamethylene, or oxybisethylene group.

3. A photopolymerizable composition as in claim 1, wherein said photopolymerizable composition further contains a benzophenone represented by formula (IIb)

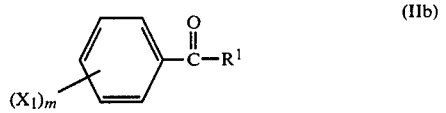

wherein $R^1$ represents a hydrogen atom or

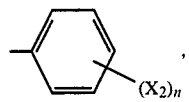

$X_1$ and $X_2$ each represents an alkyl group, an alkoxy group, a carboxy group, an alkoxycarbonyl group, an aryloxycarbonyl group, or a halogen atom, and m and n each represents 0, 1, or 2.

4. A photopolymerizable composition as in claim 1, wherein said photopolymerizable composition further contains a cyclic ketone represented by formula (IIc)

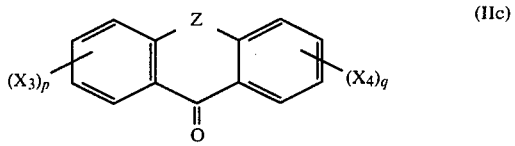

wherein $X_3$ and $X_4$ each represents an alkyl group, a alkoxy group, a carboxy group, an alkyloxycarbonyl group, an aryloxycarbonyl group, or a halogen atom, p and q each represents 0, 1, or 2, and Z represents a single bond, an oxygen atom, a sulfur atom, an alkyl-substituted or unsubstituted amino group, or a carbonyl group.

5. A photopolymerizable composition as in claim 2, wherein said compound represented by formula (IIa) is selected from the group consisting of 4,4'-bis(dimethylamino)benzophenone, 4,4'-bis(dicyclohexylamino)benzophenone, 4,4'-bis(diethylamino)benzophenone, and 4,4'-bis(dihydroxyethylamino)benzophenone.

6. A photopolymerizable composition as in claim 3, wherein said compound represented by formula (IIb) is selected from the group consisting of benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, and benzophenonetetracarboxylic acid or tetramethyl esters thereof.

7. A photopolymerizable composition as in claim 4, wherein said compound represented by formula (IIc) is selected from the group consisting of anthraquinone, 2-t-butylanthraquinone, 2-methylanthraquinone, 9-fluoroenone, xanthone, 2-chloroxanthone, thioxanthone, 2-chlorothioxanthone, 2-methylthioxanthone, 2-isopropylthioxanthone, 2,4-dimethylthioxanthone, 2,4-diethylthioxanthone, N-methylacridone, and acridone.

8. A photopolymerizable composition as in claim 1, wherein said photopolymerization initiator is present in an amount of from 0.01 to 100 parts per 100 parts by weight of the addition polymerizable unsaturated compound.

9. A photopolymerizable composition as in claim 2, wherein said compound represented by formula (IIa) is present in an amount of from 0.01 to 100 parts per 100 parts by weight of the addition polymerizable unsaturated compound.

10. A photopolymerizable composition as in claim 3, wherein said compound represented by formula (IIb) is present in an amount of from 0.01 to 100 parts per 100 parts by weight of the addition polymerizable unsaturated compound.

11. A photopolymerizable composition as in claim 4, wherein said compound represented by formula (IIc) is present in an amount of from 0.01 to 100 parts per 100 parts by weight of the addition polymerizable unsaturated compound.

12. A photopolymerizable composition as in claim 1, wherein said photopolymerization initiator is present in an amount of from 0.1 to 50 parts per 100 parts by weight of the addition polymerizable unsaturated compound.

13. A photopolymerizable composition as in claim 2, wherein said compound represented by formula (IIa) is present in an amount of from 0.1 to 50 parts per 100 parts by weight of the addition polymerizable unsaturated compound.

14. A photopolymerizable composition as in claim 3, wherein said compound represented by formula (IIb) is present in an amount of from 0.1 to 50 parts per 100 parts by weight of the addition polymerizable unsaturated compound.

15. A photopolymerizable composition as in claim 4, wherein said compound represented by formula (IIc) is present in an amount of from 0.1 to 50 parts per 100 parts by weight of the addition polymerizable unsaturated compound.

16. A photopolymerizable composition as in claim 1, wherein a polymeric binder is present in an amount of 10,000 parts or less per 100 parts by weight of the addition polymerizable unsaturated compound.

17. A photopolymerizable composition as in claim 1, wherein a thermal polymerization inhibitor is present in an amount of 50 parts or less per 100 parts by weight of the addition polymerizable unsaturated compound.

* * * * *